(12) United States Patent
Miyazawa et al.

(10) Patent No.: US 7,517,635 B2
(45) Date of Patent: Apr. 14, 2009

(54) POLYESTER COMPOUND AND RESIST MATERIAL USING THE SAME

(75) Inventors: Satoru Miyazawa, Kawagoe (JP); Satoru Kobayashi, Kawagoe (JP); Kazuhiko Maeda, Chiyoda-ku (JP)

(73) Assignee: Central Glass Company, Limited, Ube-shi (JP)

( * ) Notice: Subject to any disclaimer, the term of this patent is extended or adjusted under 35 U.S.C. 154(b) by 411 days.

(21) Appl. No.: 11/509,638

(22) Filed: Aug. 25, 2006

(65) Prior Publication Data

US 2008/0050674 A1  Feb. 28, 2008

(51) Int. Cl.
*G03C 1/73* (2006.01)
*G03F 7/039* (2006.01)
*G03F 7/038* (2006.01)
*G03F 7/09* (2006.01)
*C08G 63/137* (2006.01)

(52) U.S. Cl. ............... 430/270.1; 430/908; 430/273.1; 528/272; 528/296; 528/302; 528/305

(58) Field of Classification Search ............ None
See application file for complete search history.

(56) References Cited

U.S. PATENT DOCUMENTS

2008/0234460 A1* 9/2008 Saegusa et al. ............ 528/361

OTHER PUBLICATIONS

Takuya Hagiwara et al., "Characterization of Flouropolymer Resist for 157-nm Lithography", Journal of Photopolymer Science and Technology, vol. 16, No. 4 (2003), pp. 557-564.
Francis Houlihan et al., "New Fluorinated Resins for 157 nm Lithography Application", Journal of Photopolyer Science and Technology, vol. 16, No. 4 (2003), pp. 581-590.
Shinichi Kanna, et al., "A HFIPS-based Polymer Approach for 157 nm Single Layer Photoresist", Journal of Photopolymer Science and Technology, vol. 16, No. 4 (2003), pp. 595-600.
Takashi Sasaki et al., "A New Monocyclic Fluoropolymer for 157-nm Photoresists", Journal of Photopolymer Science and Technology, vol. 17, No. 4 (2004), pp. 639-644.

* cited by examiner

*Primary Examiner*—Sin J. Lee
(74) *Attorney, Agent, or Firm*—Crowell & Moring LLP

(57) ABSTRACT

There is provided a novel polyester compound having in its main polymer chain an aliphatic cyclic structure with carboxylic acids or carboxylic acid ester groups as represented by the chemical formula (1), a resist material containing the polyester compound and a patterning method using the resist material.

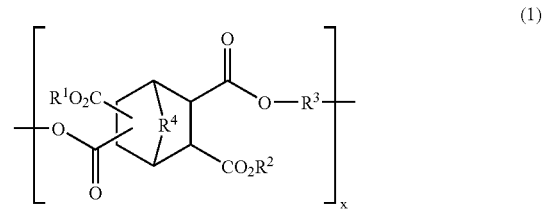

(1)

11 Claims, No Drawings

POLYESTER COMPOUND AND RESIST MATERIAL USING THE SAME

BACKGROUND OF THE INVENTION

The present invention relates to a vacuum-ultraviolet resist material and patterning method and, more particularly, to a novel polymer compound having in its main polymer chain alicyclic structures with carboxylic acid or carboxylic acid ester moieties.

The mass production of devices with 90-nm pattern resolution by 193-nm lithography technology has already started. To achieve finer device patterning such as 65-nm, 45-nm or 32-nm resolution patterning for higher-density device integration, process and material developments are being rapidly pursued. In particular, extensive development researches are being made to solve problems e.g. etching resistance and pattern edge deformation called line edge roughness (LER) arising in 65-nm resolution patterning or even finer patterning. There are some reports that the introduction of a high proportion of ring structures into a resist polymer contributes to an improvement in etching resistance. Although there are many researches on the mechanism of occurrence of LER, any of the researches does not yet reach a certain cause of LER. It is assumed that LER could be caused due to developer solubility variations and low etching resistance.

As one example of resist resin for 193-nm lithography, a (meth)acrylic ester resin is in wide use. Some reports propose the introduction of a polycyclic compound with e.g. an adamantyl, norbornyl or cholesterol derivative into ester moieties of the (meth)acrylic ester resin for etching resistance improvement. In the case of introducing a high proportion of such polycyclic structures into the (meth)acrylic ester resin for etching resistance improvement, however, the other physical properties of the (meth)acrylic ester resin required for use as the resist material, including solubility in a solvent, adhesion to a substrate and transmittance for excimer laser radiation in a vacuum-ultraviolet range, become deteriorated. The (meth)acrylic ester resin is also still low in etching resistance even when containing a high proportion of polycyclic structures, as compared to a hydroxystyrene resin for 254-nm lithography, and is in need of further etching resistance improvement. On the other hand, a resin having ring structures in its main polymer chain is being under study as an alternative to the (meth)acrylic ester resist resin. Although some reports propose the introduction of cyclopentane or cyclohexane rings to the main polymer chain of the resin for etching resistance improvement, the etching resistance of such a resist resin cannot be improved sufficiently in balance with the other physical properties e.g. solvent solubility, transmittance and resolution contrast.

[Non-Patent Publication 1] Takuya Hagiwara, Yasuhide Kawaguchi, et al., J. Photopolym. Sci. Technol., 16, 557 (2003)

[Non-Patent Publication 2] Francis Haulihan, Will Conley, Larry Rhodes, et al., J. Photopolym. Sci. Technol., 16, 581 (2003)

[Non-Patent Publication 3] Shinichi Kanna, Sanjay Malik, et al., J. Photopolym. Sci. Technol., 16, 595 (2003)

[Non-Patent Publication 4] Takashi, Sasaki, Shigeo Irie, Toshiro Itani, et al., J. Photopolym. Sci. Technol., 17, 639 (2004

Against this backdrop, there has been a demand to create novel polymer compounds having sufficient etching resistance and other required physical properties e.g. transmittance, substrate adhesion and solvent solubility for use as resist materials.

SUMMARY OF THE INVENTION

It is therefore an object of the present invention to provide a novel polymer compound capable of showing excellent etching resistance, high solubility in a solvent and good adhesion to a substrate so as to be suitable for use in a resist material and a patterning method using such a novel polymer compound.

The present inventors have found, as a result of extensive researches, that a polymer having in a main polymer chain polycyclic aliphatic rings e.g. norbornene rings and in each monomer unit two carboxylic acid functional groups soluble in an aqueous alkaline solution is preferred to solve the above conventional problems. In other words, it has been found that, when the polymer is a polyester compound, the polymer compound becomes able to achieve high etching resistance because of its aliphatic ring structures in the main polymer chain and to show high transparency over a 193-nm wavelength range of ArF laser radiation in the presence of no aromatic groups in the main polymer chain. It has also been found that the polymer compound becomes able to attain good substrate adhesion, excellent film forming capability and desirable solvent solubility by selecting appropriate carboxylic ester protecting groups. The present invention is based on these findings.

According to the present invention, there is provided a novel polymer compound represented by the general formula (1):

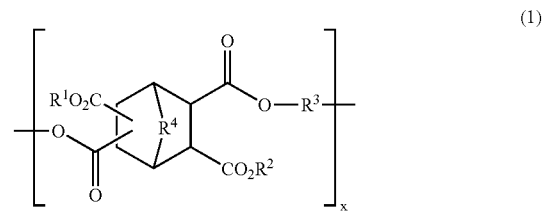

where $R^1$ and $R^2$ are the same or different and each independently represent a hydrogen atom or a $C_1$-$C_{40}$ straight-chain, branched-chain or alicyclic hydrocarbon group or aromatic-ring containing hydrocarbon group that may optionally have a fluorine, oxygen, nitrogen, silicon, sulfur, hydroxyl, carboxyl, amino, amido, glycidyl, cyano, fluorocarbinol, sulfonic acid or silyl substituent; $R^3$ represents a $C_1$-$C_{20}$ straight-chain, branched-chain or alicyclic hydrocarbon group or aromatic-ring containing divalent hydrocarbon group, some of which may optionally have a fluorine, oxygen, sulfur, silicon, carbonyl, hydroxyl, carboxyl, cyano, amino or fluoroalcohol substituent; $R^4$ represents a single bond, methylene, ethylene or oxygen atom; and X represents a polymerization degree.

The above alicyclic main chain type of polyester compound may be a polymer compound represented by the general formula (2):

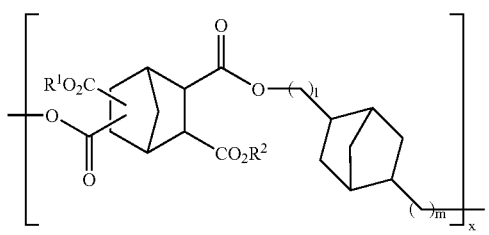

(2)

where $R^1$ and $R^2$ are the same as those of the formula (1); l and m each represent an integer of 0 to 1; and X represents a polymerization degree.

The above alicyclic main chain type of polyester compound may be a polymer compound represented by the general formula (3):

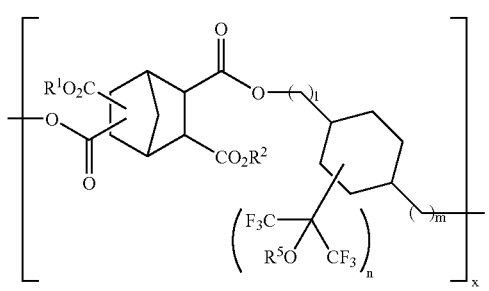

(3)

where $R^1$ and $R^2$ are the same as those of the formula (1); l and m each represent an integer of 0 to 1; n represents an integer of 0 to 2; and X represents a polymerization degree.

In the above polymer compound, at least one of $R^1$ and $R^2$ may include a hexafluorocarbinol group represented by the formula (4):

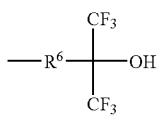

(4)

where $R^6$ represents a $C_1$-$C_{20}$ straight-chain, branched-chain or alicyclic hydrocarbon group or aromatic-ring containing hydrocarbon group that may optionally have a fluorine, oxygen or nitrogen substituent.

At least one of $R^1$ and $R^2$ may include a trifluoromethanesulfonyl amide group represented by the formula (5):

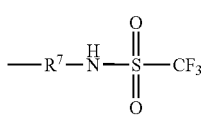

(5)

where $R^7$ represents a $C_1$-$C_{20}$ straight-chain, branched-chain or alicyclic hydrocarbon group or aromatic-ring containing hydrocarbon group that may optionally have a fluorine, oxygen or nitrogen substituent.

At least either one of $R^1$ and $R^2$ may include a lactone group.

Further, $R^1$, $R^2$ and $R^5$ may partly include an acid-unstable group.

There are also provided according to the present invention a coating composition prepared by dissolving the above polymer compound in an organic solvent, a photoresist using the above polymer compound, a liquid-immersion lithography topcoat prepared by applying the above polymer compound to a photoresist.

DETAILED DESCRIPTIONS

Hereinafter, the polymer compound of the present invention will be explained below in detail.

The polymer compound of the present invention is generally represented by the general formula (1).

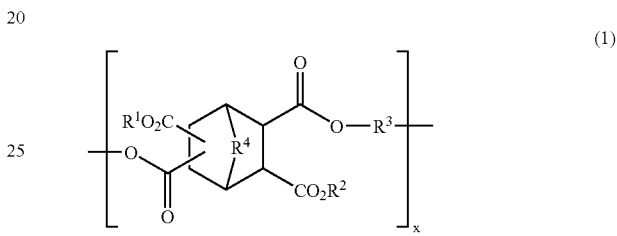

(1)

Specific examples of the polymer compound represented by the general formula (1) according to the present invention are those represented by the general formulas (2) and (3).

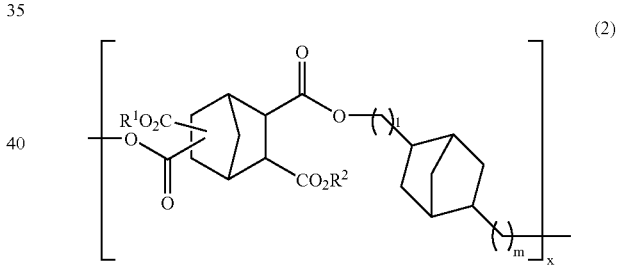

(2)

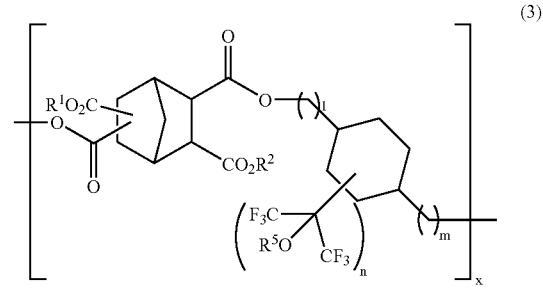

(3)

There is no particular restriction on the synthesis method of the polymer compound of the present invention. The polymer compound of the present invention can be synthesized by the application of a known synthesis reaction process or processes.

For example, the polymer compound may be obtained by, as indicated in the reaction formula [6], forming a carboxylic acid polymer by polycondensation of a bicyclo[2.2.2]octane-2,3:5,6-tetracarboxylic acid anhydride represented by the general formula (7) and a diol compound represented by the general formula (8) and protecting carboxylic acid moieties of the polymer with $R^1$ and $R^2$.

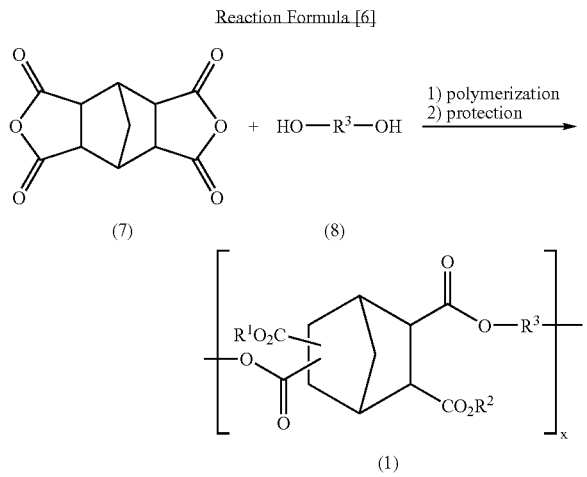

The polymer compound may alternatively be obtained by, as indicated in the reaction formula [9], causing polycondensation of a dicarboxylic acid compound represented by the general formula (10), which can be given as a derivative of the dicarboxylic acid anhydride of the formula (7), and a diol compound represented by the general formula (8), a diisocyanate compound represented by the general formula (11) or a diepoxy compound represented by the general formula (12).

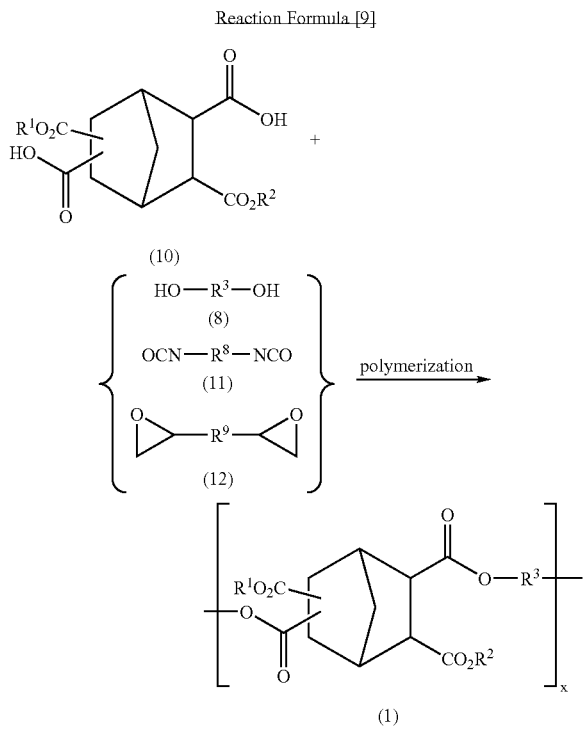

Although the polymer compound of the formula (1) can be obtained in the same way in both the reaction formulas [6] and [9], the reaction system of the formula [9] present possibilities that, depending on the conditions of the polycondensation reaction, the carboxylic acid protecting groups $R^1$ and $R^2$ may become eliminated during the polymerization or that the compound of the formula (8), (11) or (12) may become polycondensed with the ester moieties of the protecting groups $R^1$ and $R^2$ rather than the carboxylic acid moieties of the compound of the formula (10). The reaction system of the formula [9] is thus more complicated than that of the formula [6]. For this reason, a detailed explanation of the simple reaction system of the formula [6] will be given below.

As mentioned above, the polymer compound of the general formula [1] can be obtained by mixing the dicarboxylic acid anhydride of the formula (7) with the diol compound of the formula (8) and converting two carboxylic acid groups of each monomer unit of the resultant polycondensation reaction product into any appropriate ester groups.

In the formula (8), $R^3$ is a $C_1$-$C_{40}$ straight-chain, branched-chain or alicyclic hydrocarbon group or aromatic-ring containing divalent hydrocarbon group, some of which may optionally have a fluorine, oxygen, sulfur, silicon, carbonyl, hydroxyl, carboxyl, cyano, amino or fluoroalcohol substituent. Namely, some or all of hydrogen atoms of the hydrocarbon group may be substituted with fluorine atoms and the hydrocarbon group may be formed with an oxygen-containing moiety such as hydroxyl, carbonyl or ether.

As the above substituent group, there can be used a $C_1$-$C_{40}$ hydrocarbon group, preferably a $C_2$-$C_{15}$ hydrocarbon group in view of the ease of handling during the polymer synthesis and the ease of material procurement. Suitable examples of such a hydrocarbon group are ethyl, propyl, n-butyl, isobutyl, 2,2,3,3-tetrafluoro-n-butyl, cyclobutyl, n-pentyl, 2-methyl-butyl, 2,2-dimethylpropyl, 2,2,3,3,4,4-hexafluoro-n-pentyl, n-hexyl, cyclohexyl, 2,2,3,3,4,4,5,5-octafluoro-n-hexyl, n-heptyl, n-octyl, 2,2,3,3,4,4,5,5,6,6-decafluoro-n-octyl, cyclooctyl, n-nonanyl, decane, norbornyl, norbornene-2,3-dimethyl, 4,8-bis(hydroxymethyl)tricyclo[$5.2.1.0^{2,6}$]decane, 2-(1,1,1,3,3,3-hexafluoro-2-hydroxyisopropyl)cyclohexyl, 2,5-bis(1,1,3,3,3-hexafluoro-2-hydroxyisopropyl)cyclohexyl and benzene. The structure of the hydrocarbon substituent group is not particularly restricted to the above. For further improvement in etching resistance, the hydrocarbon substituent group preferably has a ring structure such as an alicyclic hydrocarbon or aromatic ring. The above substituent group, when containing hydroxyl, is able to provide an additional conversion reaction site after the polycondensation, so as to achieve a high degree of flexibility in imparting such features as transparency, adhesion, solubility in an organic solvent or aqueous alkaline solution, high glass transition temperature, cross-linking reactivity for soldering resistance, positive photosensitivity by a photo acid generator and etching resistance.

The conditions of the polymerization of the dicarboxylic acid anhydride of the formula (7) and the diol compound of the formula (8) will be next explained below.

There is no particular restriction on the reaction vessel used in the polycondensation reaction.

A polymerization solvent may be used in the polycondensation reaction. It is not however preferable to use, as the polymerization solvent, a solvent such as water or alcohol that inhibits the polycondensation reaction. The polymerization solvent is preferably dehydrated in view of the fact that the polymerization solvent, when containing a considerable amount of water, affects polymerization reactivity. Typical examples of the polymerization solvent are: ester solvents such as ethyl acetate and n-butyl acetate; ketone solvents such as acetone and methyl isobutyl ketone; hydrocarbon solvents such as toluene and cyclohexane; chloride solvents such as methylene chloride, chloroform and tetrachloromethane; and high-polar solvents such as dimethyl sulfoxide, N,N-dimethylformamide and N-methyl-2-pyrrolidone. Any other kinds of solvents such as ether solvents, cyclic ether solvents, chlorofluorocarbon solvents and aromatic solvents are also usable. These solvent materials can be used alone or in combination of two or more thereof.

The temperature of the polycondensation reaction is set appropriately and is preferably in the range of −50 to 300° C., more preferably −10 to 150° C. It is undesirable that the reaction temperature is too low because too low reaction temperature results in slow reaction progress. It is also undesirable that the reaction temperature is too high because too high reaction temperature results in by-product generation.

Various additives may be used to accelerate the polycondensation reaction. There is no particular restriction on the kinds of the additives. As one of these additives, there can be used a proton acid such as sulfuric acid, hydrochloric acid, hydrofluoric acid, methanesulfonic acid, p-toluenesulfonic acid or trifluoromethanesulfonic acid or a Lewis acid such as boron trifluoride, titanium tetrachloride, tin tetrachloride, zinc chloride, zinc triflate, scandium triflate or lanthanoide triflate. The proton acid is more preferable than the Lewis acid in view of the fact that the contamination of the resist material with a metal impurity becomes a cause of critical material deficiency. There is no particular restriction on the addition amount of the acid because the polycondensation reaction becomes accelerated even by a catalytic amount of acid. The addition amount of the acid is preferably 0.001 to 1,000 mol %, more preferably 0.1 to 50 mol %, with respect to the diol raw material (8) in view of the later acid washing process.

The polycondensation reaction can alternatively be accelerated by the addition of a base. There is no particular restriction on the kind of the base. Both of inorganic and organic bases are usable. There may be used, as the base, lithium hydride, sodium hydride, potassium hydride, sodium carbonate, potassium carbonate, calcium carbonate, pyridine, 2,6-lutidine, diisopropylamine, trimethylamine, triethylamine or trioctylamine. The organic base is more preferred in view of the metal impurity contamination. There is also no particular restriction of the addition amount of the base. The addition amount of the base is preferably 10 to 2,000 mol %, more preferably 50 to 400 mol %, with respect to the diol raw material (8) in view of the later base washing process.

There is no particular restriction on the control method of the polymerization degree. Although the polymer compound of the present invention can be obtained by the addition or condensation reaction of the acid dianhydride or dicarboxylic acid compound and the diol compound, it is possible to control the polymerization degree of the polymer compound depending on external conditions such as temperature and/or stirring conditions or terminate the polymerization at an arbitrary timing. In the case of terminating the polymerization at any arbitrary timing or in the case of designing the polymerization to be terminated in a low molecular-weight state, a monofunctional compound e.g. monocarboxylic acid, monoamine or monool is suitably added as a terminator. In this reaction termination technique, there may also be introduced a fluorocarbinol group, sulfonic acid group, unsaturated olefin group, thiol group, silicon-containing group, amino group or any other functional group to the ends of the polymer chain.

The number-average molecular weight of the polymer compound of the present invention is generally in the range of 1,000 to 100,000, preferably 2,000 to 50,000. In the formulas (1) to (3), R represents a polymerization degree and generally ranges from 1 to 100, preferably 20 to 50.

Next, $R^1$, $R^2$ and $R^5$ of the formulas (1) to (3) will be explained below.

In the formulas (1) to (3), $R^1$, $R^2$ and $R^5$ are the same or different and each independently represent a hydrogen atom or a $C_1$-$C_{40}$ straight-chain, branched-chain, alicyclic hydrocarbon group, an aromatic-ring containing hydrocarbon group or a complex thereof that may optionally have a fluorine, oxygen, nitrogen, silicon, sulfur, hydroxyl, carboxyl, amino, amido, glycidyl, cyano, fluorocarbinol, sulfonic acid or silyl substituent.

There may alternatively be used as $R^1$, $R^2$, $R^5$ an acid-unstable, adhesive or cross-linking functional group such as an alkoxycarbonyl group, acetal group, acyl group, silyl group or isocyanate group.

The alkoxycarbonyl group is that represented by —$R^a$—C(=O)O—$R^b$ where $R^a$ is a single bond or $C_1$-$C_{10}$ straight-chain, branched or cyclic alkylene or fluoroalkylene; and $R^b$ is $C_1$-$C_{10}$ straight-chain, branched or cyclic alkyl or fluoroalkyl.

The acetal group is that represented by —$R^c$—C(—$R^d$)(—$R^e$)—O$R^f$ where $R^c$ is a single bond or $C_1$-$C_{10}$ straight-chain, branched or cyclic alkylene or fluoroalkylene; $R^d$ and $R^e$ are hydrogen, straight-chain or branched alkyl, straight-chain or branched alkoxy, straight-chain or branched alkoxyalkyl, straight-chain or branched alkenyl or aryl; $R^f$ is straight-chain or branched alkyl, straight-chain or branched alkoxyalkyl, straight-chain or branched alkenyl or aryl; $R^c$, $R^d$, $R^e$ and $R^f$ may contain carbonyl in their respective carbon chains; and $R^f$ and $R^e$ may be bonded to form a ring.

The acyl group is that represented by $R^g$—C(=O)—$R^h$ where $R^g$ is a single bond or $C_1$-$C_{10}$ straight-chain, branched or cyclic alkylene or fluoroalkylene; and $R^h$ is $C_1$-$C_{10}$ straight-chain, branched or cyclic alkyl or fluoroalkyl.

Examples of the hydrocarbon groups usable as $R^1$, $R^2$ and $R^5$ are methyl, ethyl, propyl, isopropyl, cyclopropyl, n-propyl, iso-propyl, sec-butyl, tert-butyl, n-pentyl, cyclopentyl, sec-pentyl, neopentyl, hexyl, cyclohexyl, 1-methylcyclohexyl, 1-ethylcyclohexyl, norbornyl, 2-methylnorbornyl, adamantyl, 1-methyladamantyl, 1-ethyladamantyl, vinyl, allyl, butenyl, pentenyl, ethynyl, phenyl, benzyl and 4-methoxybenzil. Some or all of hydrogen atoms of these hydrocarbon groups may be substituted with fluorine atoms.

Examples of the oxygen-containing functional groups usable as $R^1$, $R^2$ and $R^5$ are: alkoxycarbonyls such as tertbutoxycarbonyl, tert-amylcarbonyl, methoxycarbonyl, ethoxycarbonyl and i-propoxycarbonyl; acetals such as linear ethers e.g methoxymethyl, methoxyethoxymethyl, ethoxyethyl, butoxyethyl, cyclohexyloxyethyl, benzyloxypropyl, phenethyloxyethyl, ethoxypropyl, benzyloxypropyl, phenethyloxypropyl, ethoxybutyl and ethoxyisobutyl and cyclic ethers e.g. tetrahydrofuranyl and tetrahydropyranyl; acyls such as acetyl, propionyl, butyryl, heptanoyl, hexanoyl, valeryl, pivaloyl, isovaleryl, lauroyl, myristoyl, palmitoyl, stearoyl, oxalyl, malonyl, succinyl, glutaryl, adipoyl, piperoyl, suberoyl, azelaoyl, sebacoyl, acryloyl, propioloyl, methacryloyl, crotonoyl, oleoyl, maleoyl, fumaroyl, mesaconoyl, camphoroyl, benzoyl, phthaloyl, isophthaloyl, terephthaloyl, naphthoyl, toluoyl, hydroatropoyl, atropoyl, cinnamoyl, furoyl, thenoyl, nicotinoyl and isonicotinoyl.

Examples of the silyl groups usable as $R^1$, $R^2$ and $R^5$ are trimethylsilyl, ethyldimethylsilyl, methyldiethylsilyl, triethylsilyl, i-propyldimethylsilyl, methyl-di-i-propylsilyl, tri-i-propylsilyl, t-butyldimethylsilyl, methyl-di-t-butylsilyl, tri-t-butylsilyl, phenyldimethylsilyl, methyldiphenylsilyl and triphenylsilyl. Some or all of hydrogen atoms of these silyl groups may be substituted with fluorine atoms.

The above protecting groups have the functions of imparting such features as transparency, adhesion, solubility in an organic solvent or aqueous alkaline solution, high glass transition temperature, cross-linking reactivity for soldering resistance, positive photosensitivity by a photo acid generator and etching resistance. The functions of these protecting groups can be applied selectively. As already mentioned above, $R^1$, $R^2$ and $R^5$ are the same or different from one another.

In order to control the solvent solubility of the polymer compound, $R^1$, $R^2$, $R^5$ may preferably include a hexafluorocarbinol group represented by the general formula (4) or a trifluoromethanesulfonyl amide group represented by the general formula (5).

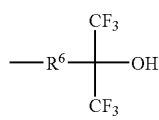

(4)

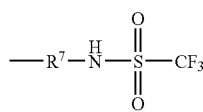

(5)

The above hexafluorocarbinol or trifluoromethanesulfonyl amide group may be contained by a plural number in each of $R^1$, $R^2$ and $R^5$. More specifically, for example, $R^1$ may contain a plurality of hexafluorocarbinols.

In the formulas (4) and (5), $R^6$ and $R^7$ each represent a $C_1$-$C_{20}$ straight-chain, branched-chain, alicyclic hydrocarbon group or aromatic-ring containing hydrocarbon group that may optionally have a fluorine, oxygen or nitrogen substituent. Namely, either a straight-chain, branched-chain, cyclic, polycyclic or aromatic hydrocarbon group is usable as $R^6$, $R^7$. Some or all of hydrogen atoms of the hydrocarbon group may be substituted with fluorine atoms. The hydrocarbon group may be formed with an oxygen-containing moiety such as hydroxyl, carbonyl or ether.

As $R^6$, $R^7$, there can be preferably used a $C_1$-$C_{40}$ hydrocarbon group, more preferably a $C_2$-$C_{15}$ hydrocarbon group in view of the ease of handling during the polymer synthesis and the ease of material procurement. Suitable examples of $R^6$ and $R^7$ are ethyl, propyl, n-butyl, isobutyl, 2,2,3,3-tetrafluoro-n-butyl, n-pentyl, cyclopentyl, 2-methylbutyl, n-hexyl, cyclohexyl, n-heptyl, n-octyl, cyclooctyl, n-nonanyl, decane, norbonyl, 2-methylnorbonyl, 2-ethylnorbonyl, norbornene-2,3-dimethyl and benzene. The structure of the hydrocarbon group is not particularly restricted to the above. In order to control the solvent solubility of the polymer compound and to impart etching resistance to the polymer compound, the above hydrocarbon group is preferably formed with a ring structure.

Further, at least one of $R^1$ and $R^2$ may have a lactone group. The lactone group is one of suitable substituent groups, because not only does the ring structure of the lactone group contribute to etching resistance improvement but also the hydrophilic moiety e.g. carbonyl group or oxygen atom of the lactone group promotes substrate adhesion.

It is desirable that the protecting groups are those eliminated by an acid (such protecting groups are hereinafter referred to as acid-unstable groups) in order for the polymer compound to show positive photosensitivity and solubility in an aqueous alkaline solution after exposure to high-energy radiation such as far-ultraviolet radiation with wavelengths of 300 nm or shorter, excimer laser radiation, X-ray radiation or soft X-ray radiation or electron beam radiation. Among the above substituent groups, preferred are tertiary-ester forming groups such as tert-butyl, 1-methylcyclohexyl, 1-ethylcyclohexyl, 2-methylnorbornyl, 1-methyladamantyl and 1-ethyladamantyl, alkoxycarbonyls and acetals. Each of the protecting groups is able to impart transparency when having a fluorine-containing functional moiety and is able to impart etching resistance and high glass transition temperature when having a ring structural moiety. These groups are used selectively depending on the application field of the polymer compound of the present invention.

The protecting groups can be introduced by a known introduction process or processes with no particular restriction. There are various conceivable introduction methods: one method is to convert carboxylic acid groups into acid chloride groups by thionyl chloride etc. and then react the acid chloride groups with alcohols corresponding to the protecting groups; another method is to convert carboxylic acid groups into carboxylate groups by a base e.g. sodium hydride and then react the carboxylate groups with halides corresponding to the protecting groups; and still another method is to cause addition of carboxylic acid groups and unsaturated compounds corresponding to the protecting groups.

The temperature of the protection reaction is set appropriately based on the reactivity of the protection reaction sites due to their electron densities and volumes and is preferably in the range of $-50$ to $200°$ C., more preferably $-10$ to $100°$ C. It is undesirable that the reaction temperature is too low because too low reaction temperature results in slow reaction progress. It is also undesirable that the reaction temperature is too high because too high reaction temperature results in by-product generation.

It is desirable to use a reaction solvent in the protection reaction for uniform reaction and thermal radiation although the reaction solvent is not necessarily used. Examples of the protection reaction solvent are: ether solvents such as diethyl ether, tetrahydrofuran, diisopropyl ether and di-tert-butyl ether; ketone solvents such as acetone and methyl isobutyl ketone; hydrocarbon solvents such as toluene and cyclohexane; chloride solvents such as methylene chloride, chloroform and tetrachloromethane and high-polar solvents such as dimethyl sulfoxide, N,N-dimethylformamide and N-methyl-2-pyrrolidone. Any other kinds of solvents such as chlorofluorocarbon solvents and aromatic solvents are also usable. These solvent materials can be used alone or in combination of two or more thereof.

When the protecting groups are of two or more kinds, the protection reaction is performed simultaneously or successively.

In the case where the protection reaction conditions are the same for two or more kinds of protecting groups, these protecting groups can be introduced at one time. In such a case, any known protection reaction process or processes are applicable without particular restriction. The protection reaction can be performed arbitrarily by controlling the preparation amounts of the reactant compounds corresponding to the protecting groups.

In the case where the protection reaction conditions are different, by contrast, the protecting groups have to be introduced in stages. Any known protection reaction process or processes are also applicable without particular restriction in this case. It is however necessary to consider the acid or base stability of each protecting group so as not to cause decomposition or degradation of the previously introduced protecting group or groups. The relative proportions of the protecting groups can be controlled arbitrarily depending on the preparation amounts of the reactant compounds corresponding to the protecting groups.

The polymer compound of the present invention is suitable for a resist material. In the resist material, a solution inhibitor is mixed with or incorporated into the polymer compound to change the solubility of the polymer compound in an aqueous alkaline solution by the action of an acid. In either case, the resist material is suitably used for a positive resist and is also suitably used for a positive 248-nm KrF or 193-nm ArF excimer laser resist or vacuum-ultraviolet laser resist typified by 157-nm $F_2$ laser resist, an electron beam resist and an X-ray resist in response to the recent trend toward semiconductor microprocessing. The solution inhibitor, which changes the solubility of the polymer compound in aqueous alkaline solution by acid action, can be formed by modifying at least one of carboxylic acid or hexafluorocarbinol groups into an acid-unstable group. There is no particular restriction on the structure of the solution inhibitor. The acid-unstable group is generally a functional group capable of being cleaved by an acid, and examples of the acid-unstable group are those mentioned above. The polymer compound using such a solution inhibitor is insoluble or hardly soluble in the aqueous alkaline solution before exposure to activation energy radiation and become soluble in the aqueous alkaline solution after hydrolyzed by an acid generated from the acid generator upon exposure to active energy radiation.

There is no particular restriction on the kind of the photo acid generator used in the resist material of the present invention. Any of chemical sensitization resist acid generators can be used selectively as the photo acid generator. Examples of such an acid generator are bis-sulfonyldiazomethanes, nitrobenzyl derivatives, onium salts, halogen-containing triazine compounds, cyano-containing oxime sulfonate compounds and other oxime sulfonate compounds. These acid generator compounds can be used alone or in combination of two or more thereof. The amount of the acid generator in the resist material is usually in the range of 0.5 to 20 parts by weight with respect to 100 parts by weight of the polymer compound. When the acid generator amount is less than 0.5 parts by weight, the resist material cannot attain a sufficient image forming capability. When the acid generator amount exceeds 20 parts by weight, it becomes difficult to form a uniform solution of the resist material so that the resist material tends to be low in storage stability.

The resist material of the present invention is applicable to a conventional photoresist patterning technique. The photoresist pattering can be suitably performed by applying a solution of resist material to a board e.g. a silicon wafer, drying the solution to form a photosensitive layer of resist material, exposing the photosensitive layer to an excimer laser via a desired masking pattern by a photolithographic machine, and then, developing the resist material with a developer such as an aqueous alkaline solution of e.g. 0.1 to 10 wt % tetramethylammonium hydroxide. In this patterning process, it is possible to obtain a resist pattern in faithful accordance with the masking pattern.

Depending on the area of application of the resist material, various miscible additives such as an additional resin, a quencher, a plasticizer, a stabilizer, a colorant, a surfactant, a thickner, a leveling agent, an anti foaming agent, a compatibilizer, a contact agent and an antioxidant may be added.

The polymer compound of the present invention is also suitable for a liquid-immersion lithography topcoat (i.e. a protective coating film of polymer applied to a photoresist for the purpose of preventing the interaction of the resist with a liquid used in liquid-immersion lithography, such as swelling of the resist, impregnation of the resist with the liquid and extraction of a compound from the resist). To use the polymer compound for the liquid-immersion lithography topcoat, it is necessary to attain not only the function of the protective coating film but also solubility in a developer (aqueous alkaline solution) under development. In view of the solubility, the polymer compound of the present invention is suitably used in the liquid-immersion lithography topcoat.

Namely, it is desirable that, in the formula (1), $R^1$ and $R^2$ are hydrogen, or that 5 to 100 mol %, more preferably 50 to 100 mol %, of $R^1$, $R^2$ is the protecting groups having hexafluorocarbinol of the formula (4) or trifluoromethanesulfonyl amide of the formula (5), in the case of using the polymer compound of the present invention in the liquid-immersion lithography topcoat.

For use in the topcoat, the polymer compound is dissolved in an organic solvent or a mixture of an aqueous alkaline solution or water and an organic solvent. The organic solvent can be selected appropriately from those being unlikely to cause erosion of the lower resist film layer and extraction of an additive or additives from the resist film and having a boiling point suitable for a spin coat method, i.e., a boiling point of approximately 70 to 170° C. Examples of such an organic solvent are various hydrocarbons, alcohols, ethers, esters and fluorides although the organic solvent should be selected depending on the composition of the lower resist layer. Preferred are: alkanes such as pentane, hexane, heptane, octane, nonane and decane; cycloaklanes; and hydrocarbon alcohols such as butanols (n-buthanol, iso-butanol, t-butanol), methylethylcarbinol, pentanol, amylalcohol, hexylalcohol and heptylalcohol. Partially fluorine substituted hydrocarbon solvents are more preferred. Herein, the partially fluorine substituted hydrocarbon solvents are defined as hydrocarbons such as alkanes and cycloalkanes and hydrocarbon alcohols in each of which some of hydrogen atoms are substituted with fluorine atoms. The fluorine substitution of the solvent allows efficient dissolution of the polymer compound and application of the topcoat with no damage to the lower resist layer.

Additives such as an acid generator and a quencher may be added in advance to the topcoat in order to minimize the effect of any extract from the lower resist layer. The acid generator is particularly effective in enhancing the resolution of the lower resist layer in liquid immersion lithography.

There may also be used a hydrophobic additive for controlling the effect of water on the resist swelling and impregnation and an acidic additive for enhancing the solubility of the topcoat composition in the developer.

The topcoat composition of the present invention can be used with no restriction on the kind of the lower resist film layer. The topcoat composition is suitable for any resist system even when lower resist layer of the resist system is of negative type, positive type or complex type and is also suitable for use with various light sources such as a 193-nm ArF excimer laser, a vacuum-ultraviolet laser typified by a 157-nm $F_2$ laser, or any other activation energy radiation such as an electron beam or X-ray in response to the recent trend toward semiconductor microprocessing.

In device manufacturing using liquid immersion lithography, the topcoat of the present invention can be suitably formed by applying a solution of resist material to a substrate e.g. a silicon wafer or semiconductor substrate by a spinner etc., drying the solution to form a photosensitive layer of resist material, applying a topcoat layer of the polymer compound to the photosensitive layer by a spinner etc., drying the topcoat layer, exposing the resultant laminate to a laser via a desired masking pattern under water immersion conditions,

EXAMPLE 1

Synthesis of Polyester Compound (13)

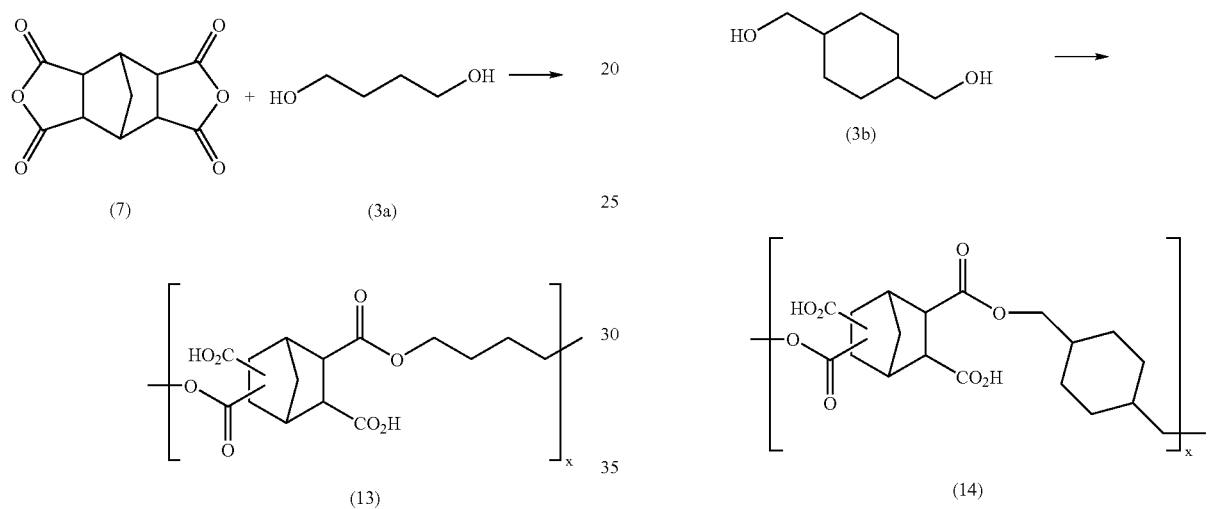

Bicyclo[2.2.2]octane-2,3:5,6-tetracarboxylic acid anhydride (7) (5.51 g) and 1,4-butadiol (3a) (2.19 g) were mixed into N,N-dimethylformamide (44.0 ml) within a 100-ml four-neck flask. The resultant mixed solution was cooled in an ice-water bath so that the internal temperature of the mixed solution reached 5° C., followed by dropping triethylamine (4.97 g) into the solution with stirring over 15 minutes. After that, the solution was stirred for 5 minutes under ice-water cooling, heated to 50° C. in an oil bath and stirred for 8 hours. This reaction solution was left and cooled, and then, dropped into acetone (2,000 ml) with stirring over 30 minutes under a room temperature condition to reprecipitate a powdery substance out of the solution. After the solution was stirred for further 1 hour, the precipitate powder was recovered by suction filtration. The recovered powder was dissolved into methanol (40 ml). The solution was dropped into acetone (2,000 ml) with stirring over 30 hours under a room temperature condition to reprecipitate the powdery substance. After the solution was stirred for further 1 hour, the precipitate powder was recovered by suction filtration. The recovered powder was dried for 10 hours at 50° C. in an oven under a reduced pressure, thereby yielding a white powdery reaction product (0.71 g). The molecular weight (Mw) and the molecular-weight distribution (Mw/Mn) of the reaction product were determined by gel permeation chromatography (GPC using polystyrene standard) to be Mw=13,000 and Mw/Mn=5.06.

EXAMPLE 2

Synthesis of Polyester Compound (14)

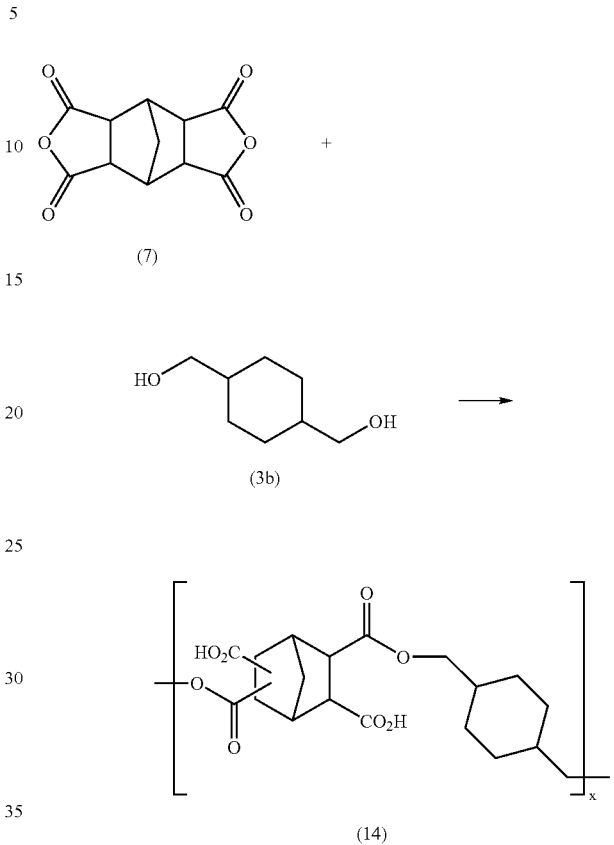

Bicyclo[2.2.2]octane-2,3:5,6-tetracarboxylic acid anhydride (4) (10.18 g) and cyclohexane-1,4-dimethanol (3b) (6.20 g) were mixed into toluene (44.0 ml) within a 100-ml four-neck flask, followed by adding thereto methanesulfonic acid (0.38 g). The resultant mixed solution was heated to 80° C. in an oil bath and stirred for 5 hours. At this time, a resin precipitate was observed in the reaction solution. After the reaction solution was left and cooled, acetone (88.0 ml) was added into the solution to dissolve the precipitate. A part of the precipitate was considered to be a high molecular weight component and left in a swelling state without being dissolved in the solution. This swelling component was removed by filtration. The filtrate was dropped into n-hexane (2,000 ml) with stirring over 1 hour under a room temperature condition to reprecipitate a powdery substance. After the solution was stirred for further 1 hour, the precipitate powder was recovered by suction filtration. The recovered powder was dried for 6 hours at 50° C. in an oven under a reduced pressure, thereby yielding a white powdery reaction product (15.18 g). The molecular weight (Mw) and the molecular-weight distribution (Mw/Mn) of the reaction product were determined by gel permeation chromatography (GPC using polystyrene standard) to be Mw=5,900 and Mw/Mn=2.85.

EXAMPLE 3

Synthesis of Polyester Compound (15)

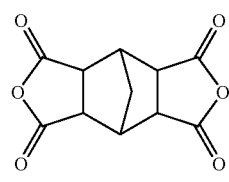

(7)

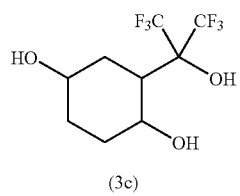

(3c)

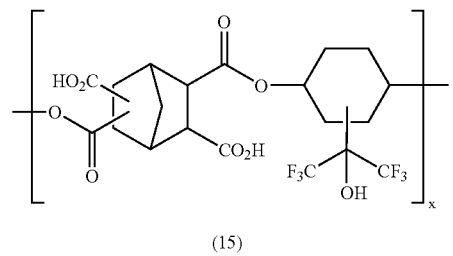

(15)

Bicyclo[2.2.2]octane-2,3:5,6-tetracarboxylic acid anhydride (4) (5.13 g) and 2-(1,1,1,3,3,3-hexafluoro-2-hydroxyisopropyl)cyclohexane-1,4-diol (3c) (6.13 g) were mixed into toluene (21.7 ml) within a 100-ml four-neck flask, followed by adding thereto methanesulfonic acid (0.27 g). The resultant mixed solution was heated to 80° C. in an oil bath and stirred for 18 hours. This reaction solution was left and cooled, and then, dropped into n-hexane (2,000 ml) with stirring over 1 hour under a room temperature condition to reprecipitate a powdery substance out of the solution. After the solution was stirred for further 1 hour, the precipitate powder was recovered by suction filtration. The recovered powder was dried for 6 hours at 50° C. in an oven under a reduced pressure, thereby yielding a white powdery reaction product (9.30 g). The molecular weight (Mw) and the molecular-weight distribution (Mw/Mn) of the reaction product were determined by gel permeation chromatography (GPC using polystyrene standard) to be Mw=1,300 and Mw/Mn=1.27.

EXAMPLE 4

Synthesis of Polyester Compound (14a)

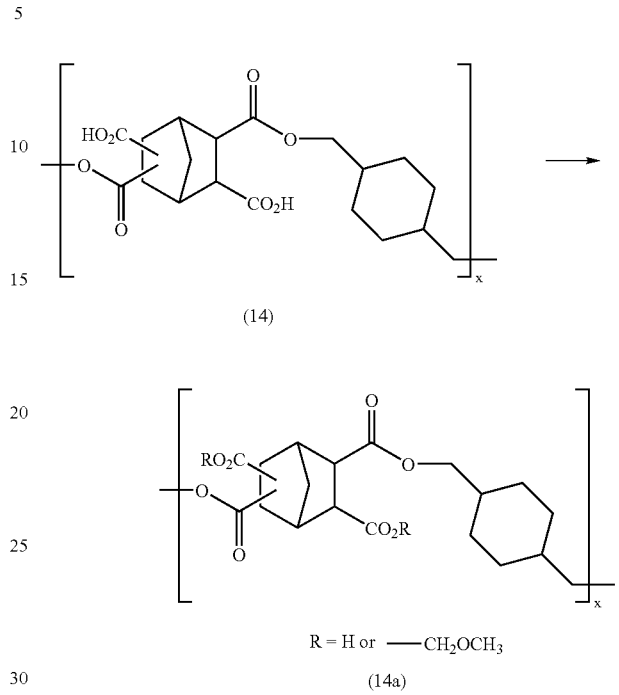

R = H or —CH$_2$OCH$_3$ (14a)

The polyester compound (14) (2.000 g) of Example 2 was dissolved in tetrahydrofuran (20.0 ml) within a 50 ml three-neck flask, followed by gradially adding thereto 55% sodium hydride (0.459 g) with stirring under ice cooling. Methoxymethyl chloride (0.847 g) was added to the solution with stirring under ice cooling. Tetra-n-butylammonium iodide (0.097 g) was further added to the solution with stirring under ice cooling. This reaction solution was heated to room temperature, stirred for 8 hours and gradually dropped into ice water (100 ml). An organic phase was extracted by adding ethyl acetate (150 ml) to the solution. The extracted organic phase was washed with water, recovered by phase separation and then concentrated under a reduced pressure by an evaporator to give a concentrated residue solution (20 g). The residue solution was dropped into n-hexane (600 ml) with stirring over 5 minutes under a room temperature condition, whereby a powdery substance was reprecipitated out of the solution. After the solution was stirred for further 1 hour, the precipitate powder was recovered by suction filtration. The recovered powder was dried for 8 hours at 50° C. in an oven under a reduced pressure, thereby yielding a white powdery reaction product (1.234 g). The rate of protection with methoxymethyl groups was measured by thermogravimetry-differential thermal analysis (TG-DTA) to be 56.3% on the assumption that the amount of decrease in weight was caused by elimination of the methoxymethyl groups. The molecular weight (Mw) and the molecular-weight distribution (Mw/Mn) of the reaction product were determined by gel permeation chromatography (GPC using polystyrene standard) to be Mw=7,600 and Mw/Mn=3.01.

EXAMPLE 5

Synthesis of Polyester Compound (15a)

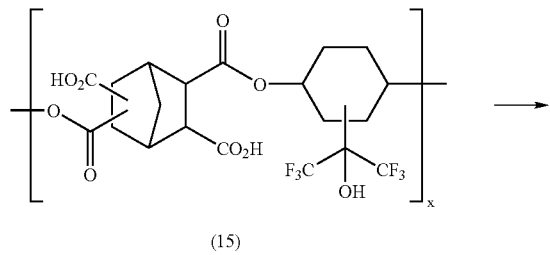

(15)

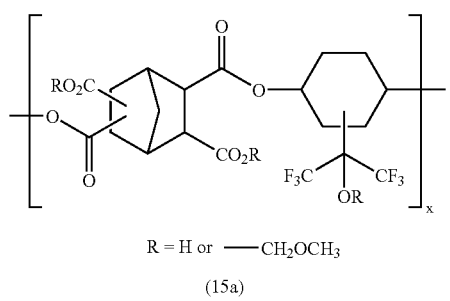

R = H or —CH$_2$OCH$_3$ (15a)

The polyester compound (15) (2.131 g) of Example 3 was dissolved in tetrahydrofuran (21.0 ml) within a 50-ml three-neck flask, followed by gradially adding thereto 55% sodium hydride (0.524 g) with stirring under ice cooling. Methoxymethyl chloride (0.967 g) was added to the solution with stirring under ice cooling. Tetra-n-butylammonium iodide (0.074 g) was further added to the solution with stirring under ice cooling. This reaction solution was heated to room temperature, stirred for 14 hours and gradually dropped into ice water (100 ml). An organic phase was extracted by adding ethyl acetate (150 ml) to the solution. The extracted organic phase was washed with water, recovered by phase separation and then concentrated under a reduced pressure by an evaporator to give a concentrated residue solution (20 g). The residue solution was dropped into n-hexane (600 ml) with stirring over 5 minutes under a room temperature condition, whereby a powdery substance was reprecipitated out of the solution. After the solution was stirred for further 1 hour, the precipitate powder was recovered by suction filtration. The recovered powder was dried for 8 hours at 50° C. in an oven under a reduced pressure, thereby yielding a white powdery reaction product (2.341 g). The rate of protection with methoxymethyl groups was measured by thermogravimetry-differential thermal analysis (TG-DTA) to be 79.4% on the assumption that the amount of decrease in weight was caused by elimination of the methoxymethyl groups. The molecular weight (Mw) and the molecular-weight distribution (Mw/Mn) of the reaction product were determined by gel permeation chromatography (GPC using polystyrene standard) to be Mw=1,300 and Mw/Mn=1.25.

EXAMPLE 6

Synthesis of Polyester Compound (14b)

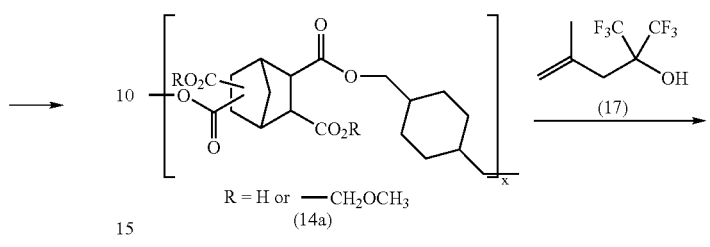

R = H or —CH$_2$OCH$_3$ (14a)

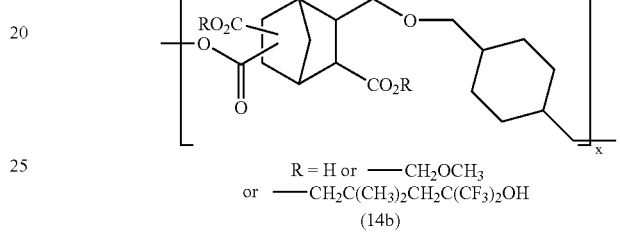

R = H or —CH$_2$OCH$_3$
or —CH$_2$C(CH$_3$)$_2$CH$_2$C(CF$_3$)$_2$OH (14b)

The polyester compound (14a) (1.000 g) of Example 4 was dissolved in toluene (10.0 ml) within a 50-ml three-neck flask, followed by gradially adding thereto a compound (17) (1.000 g) with stirring under a room temperature condition. This mixed solution was heated to 70° C. and stirred for 2 hours. The resultant reaction solution was gradually dropped into ice water (100 mm). An organic phase was extracted by adding ethyl acetate (150 ml) to the solution. The extracted organic phase was washed with water, recovered by phase separation and then concentrated under a reduced pressure by an evaporator to give a concentrated residue solution (10 g). The residue solution was dropped into n-heptane (400 ml) with stirring over 5 minutes under a room temperature condition, whereby a powdery substance was reprecipitated out of the solution. After the solution was stirred for further 1 hour, the precipitate powder was recovered by suction filtration. The recovered powder was dried for 8 hours at 50° C. in an oven a reduced pressure, thereby yielding a white powdery reaction product (1.153 g). The rate of protection with methoxymethyl groups was measured by thermogravimetry-differential thermal analysis (TG-DTA) to be 32.4% on the assumption that the amount of decrease in weight was caused by elimination of the methoxymethyl groups. There was a decrease in protection rate observed between before and after the reaction. The content of hexafluorocarbinol groups in the reaction product was determined by $^{19}$F-NMR analysis (i.e. the content of the compound (17) in the resin was determined by adding as internal standard a known amount of 4-fluorobenzoic acid and calculating the molar amount of the compound (17) introduced as the protecting groups from an integration ratio of $^{19}$F-NMR spectrum) to be 65.0%. The molecular weight (Mw) and the molecular-weight distribution (Mw/Mn) of the reaction product were determined by gel permeation chromatography (GPC using polystyrene standard) to be Mw=7,700 and Mw/Mn=2.99.

EXAMPLE 7

Synthesis of Polyester Compound (15b)

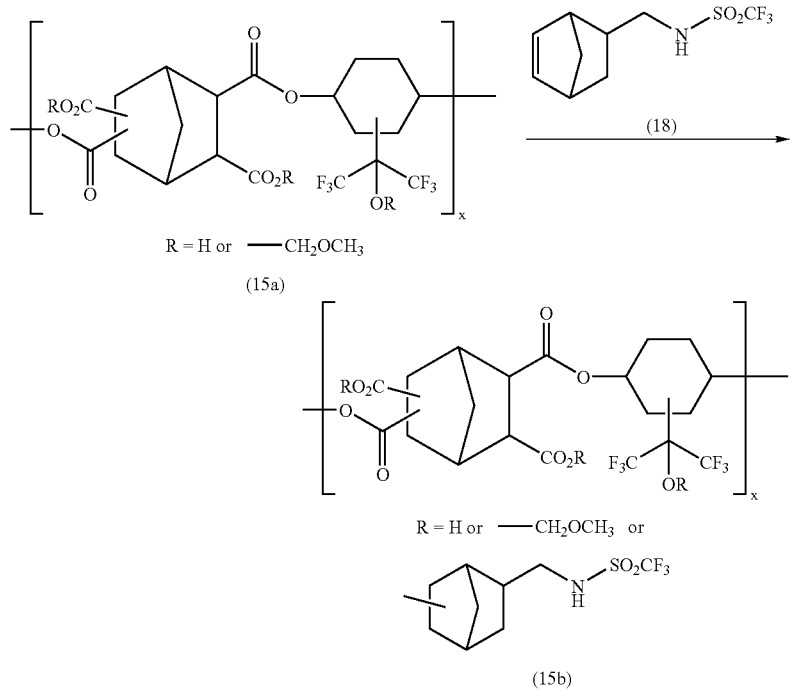

The polyester compound (15a) (0.500 g) of Example 5, a compound (18) (0.500 g) and toluene (5.00 ml) were charged into a 50-ml three-neck flask. This mixed solution was heated to 70° C. and stirred for 2 hours. The resultant reaction solution was gradually dropped into ice water (50 mm). An organic phase was extracted by adding adding ethyl acetate (100 ml) to the solution. The extracted organic phase was washed with water, recovered by phase separation and then concentrated under a reduced pressure by an evaporator to give a concentrated residue solution (5 g). The residue solution was dropped into n-heptane (200 ml) with stirring over 3 minutes under a room temperature condition, whereby a powdery substance was reprecipitated out of the solution. After the solution was stirred for further 1 hour, the precipitate powder was recovered by suction filtration. The recovered powder was dried for 8 hours at 50° C. in an oven under a reduced pressure, thereby yielding a white powdery reaction product (0.512 g). The rate of protection with methoxymethyl groups was measured by thermogravimetry-differential thermal analysis (TG-DTA) to be 31.1% on the assumption that the amount of decrease in weight was caused by elimination of the methoxymethyl groups. There was a slight decrease in protection rate observed between before and after the reaction. The content of trifluoromethanesulfonylamide-substituted norbornyl groups in the reaction product was determined by $^{19}$F-MR analysis (i.e. the content of the compound (18) in the resin was determined by adding as internal standard a known amount of 4-fluorobenzoic acid and calculating the molar amount of the compound (18) introduced as the protecting group from an integration ratio of $^{19}$F-NMR spectra) to be 65.4%. The molecular weight (Mw) and the molecular-weight distribution (Mw/Mn) of the reaction product were determined by gel permeation chromatography (GPC using polystyrene standard) to be Mw=1,300 and Mw/Mn=1.31.

EXAMPLE 8

Preparation and Evaluation of Resist Compositions

The polyester compounds of Examples 6 and 7 were dissolved into propylene glycol monomethyl ether acetate to prepare respective solutions with a solid content of 14%, followed by dissolving 2 parts by weight of triphenylsolfonium triflate (TPS105) available from Midori Kagaku Co., Ltd. as an acid generator per 100 parts by weight of the polymer compound. The resultant two resist solutions were spin-coated to form films of the polymer compounds with a thickness of 100 nm. Each of these films was tested for its 157-nm light transmittance. The film of the polymer compound of Example 6 had a transmittance of 48%, whereas the film of the polymer compound of Example 7 had a transmittance of 45%. Both of the polymer films thus showed high transparency in the vacuum ultraviolet range.

The resist solutions were filtrated by 0.2 µm-pore membrane filters and spin-coated on silicon wafers to form resist films with a thickness of 250 nm. The resist films were prebaked at 120° C., exposed to 248-nm ultraviolet radiation via photomasks, subjected to post-exposure baking at 130° C., and then, developed at 23° C. for 1 minute using 2.38 wt % aqueous tetramethylammonium hydroxide solution. As a consequence, a high-resolution pattern was obtained from each of the resists solutions with almost no performance deficiencies such as poor substrate adhesion, poor film formation defect, poor development and poor etching resistance.

EXAMPLE 9

Preparation and Evaluation of Topcoat

The polymer compound of Example 3 wad dissolved in a mixed solvent of t-buthanol/n-hexane=8/2 to prepare a solution with a solid content of 3%. The resultant polymer solution was uniform and transparent.

The polymer solution was spin-coated on silicon wafers and baked at 110° C. to from uniform topcoat films. When one of the topcoat films was immersed in 2.38 wt % aqueous tetramethylammonium hydroxide solution, the film quickly dissolved in the solution and disappeared.

When another one of the topcoat films was immersed in pure water for 30 minutes, the film did not swell or dissolve in the water.

EXAMPLE 10

Preparation and Evaluation of Topcoat

The polymer solution of Example 9 was spin-coated with a thickness of about 40 nm on a photoresist film, which had been obtained in the same manner as in the after-mentioned comparative example, and baked at 110° C. to thereby form a uniform topcoat film on the photoresist film. The laminate of these two films was immersed in 2.38 wt % aqueous tetramethylammonium hydroxide solution. Only the topcoat film quickly dissolved in the solution, and the photoresist film remained as it was.

EXAMPLE 11

Preparation and Evaluation of Topcoat

The polymer solution of Example 9 was spin-coated with a thickness of about 40 nm on a photoresist film, which had been obtained in the same menner as in the after-mentioned comparative example, and baked at 110° C. to thereby form a topcoat film on the photoresist film. Pure water was applied with a thickness of 1 mm to the laminate of these two films. Using a high-pressure mercury lamp, a ultraviolet light was irradiated via a photomask onto the film laminate from above the water surface for exposure of the film laminate. The pure water was removed, and then, the film laminate was subjected to post-exposure baking at 130° C. and developed at 23° C. for 1 minute using 2.38 wt % aqueous tetramethylammonium hydroxide solution. The whole of the topcoat film and the exposed area of the resist film dissolved simultaneously in the solution, and the unexposed area of the resist film remained in a rectangular pattern.

COMPARATIVE EXAMPLE

A compound (16) (20.00 g), a compound (17) (27.78 g), a compound (18) (36.72 g), azobisisobutyronitrile (AIBN) (0.2540 g), n-decylmercaptan (0.3965 g) and methyl ethyl ketone (253.4 g) were poured into a 500-ml pear-shaped flask with a reflux condenser and a stirring bar. The flask was filled with a nitrogen gas and heated at 75° C. in an oil bath. In this state, the solution was stirred for 18 hours. After the completion of the reaction, the reaction solution was dropped into n-hexane (2,000 ml) and stirred to cause a precipitate. The precipitate was recovered by filtration and dried for 20 hours at 50° C. in an oven under a reduced pressure, thereby yielding a polymer compound (19) (38.97 g) suitable for ArF excimer laser exposure. The molecular weight (Mw) and the molecular-weight distribution (Mw/Mn) of the polymer compound were determined by gel permeation chromatography (GPC using polystyrene standard) to be Mw=12,600 and Mw/Mn=1.81.

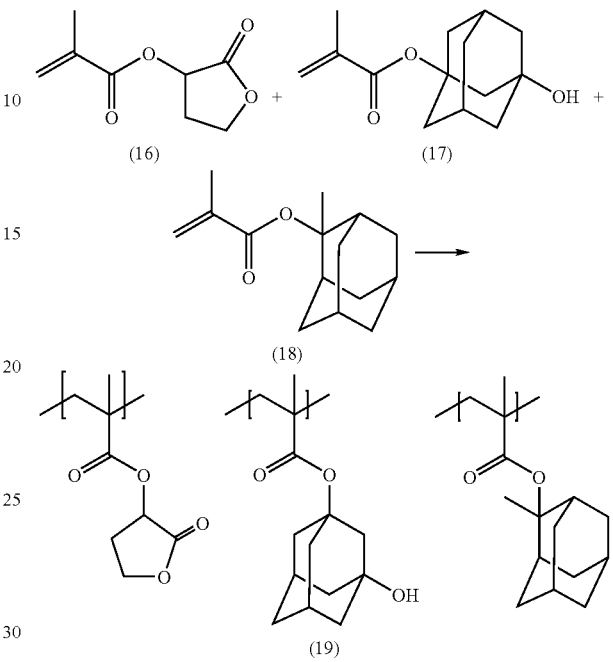

The polymer compound (19) was dissolved in propylene glycol monomethyl acetate to prepare a solution with a solid content of 12%, followed by dissolving 2 parts by weight of triphenylsolfonium triflate (TPS105) available from Midori Kagaku Co., Ltd. as an acid generator per 100 parts by weight of the polymer compound (19). The resultant resist solution was spin-coated and baked at 110° C. to form a resist film. Pure water was applied with a thickness of 1 mm to the resist film. Using a high-pressure mercury lamp, a ultraviolet light was irradiated via a photomask onto the resist film from above the water surface for exposure of the resist film. The pure water was removed, and then, the resist film was subjected to post-exposure baking at 130° C. and developed at 23° C. for 1 minute using 2.38 wt % aqueous tetramethylammonium hydroxide solution. Although the exposed area of the resist film dissolved in the solution and the unexposed area of the resist film remained in a resist pattern, the resist pattern was not rectangular but was in the form of T-top shape.

What is claimed is:

1. A polymer compound represented by the general formula (1):

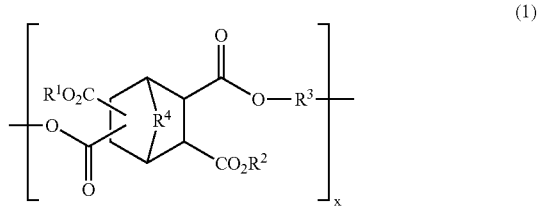

where $R^1$ and $R^2$ are the same or different and each independently represent a hydrogen atom or a $C_1$-$C_{40}$ straight-chain, branched-chain or alicyclic hydrocarbon group or aromatic-ring containing hydrocarbon group that may optionally have a fluorine, oxygen, nitrogen, silicon, sulfur, hydroxyl, carboxyl, amino, amido, glycidyl, cyano, fluorocarbinol, sulfonic acid or silyl substituent; $R^3$ represents a $C_1$-$C_{20}$ straight-chain, branched-chain or alicyclic group or aromatic-ring containing divalent hydrocarbon group, some of which may optionally have a fluorine, oxygen, sulfur, silicon, carbonyl, hydroxyl, carboxyl, cyano, amino or fluoroalcohol substituent; $R^4$ represents a single bond, methylene, ethylene or oxygen atom; and X represents a polymerization degree.

2. The polymer compound according to claim 1, represented by the general formula (2):

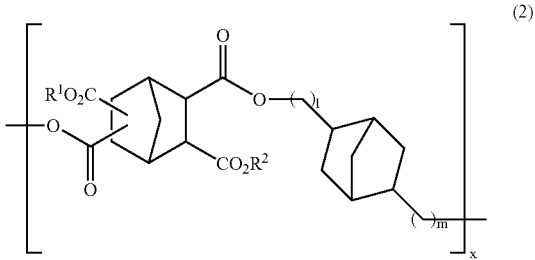

(2)

where $R^1$ and $R^2$ are the same as those of the formula (1); l and m each represent an integer of 0 to 1; and X represents a polymerization degree.

3. The polymer compound according to claim 1, represented by the general formula (3):

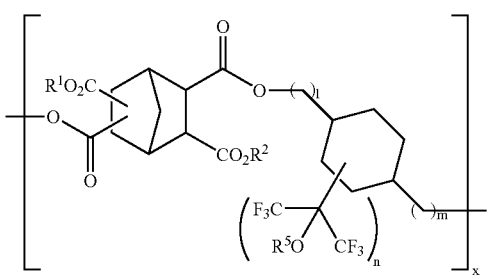

(3)

where $R^1$ and $R^2$ are the same as those of the formula (1); $R^5$ represents a hydrogen atom or a $C_1$-$C_{40}$ straight-chain, branched-chain or alicycic hydrocarbon group or aromatic-ring containing hydrocarbon group, some of which may optionally have a fluorine, oxygen, nitrogen, silicon, sulfur, hydroxyl, carboxyl, amino, amido, glycidyl, cyano, fluorocarbinol, sulfonic acid or silyl substituent; l and m each represent an integer of 0 to 1; n represents an integer of 0 to 2; and X represents a polymerization degree.

4. The polymer compound according to claim 3, wherein $R^5$ partly includes an acid-unstable group.

5. The polymer compound according to claim 1, wherein at least one of $R^1$ and $R^2$ includes a hexafluorocarbinol group represented by the general formula (4):

(4)

where $R^6$ represents a $C_1$-$C_{20}$ straight-chain, branched-chain or alicyclic hydrocarbon group or aromatic-ring containing hydrocarbon group that may optionally have a fluorine, oxygen or nitrogen substituent.

6. The polymer compound according to claim 1, wherein at least one of $R^1$ and $R^2$ includes a trifluoromethanesulfonyl amide group represented by the general formula (5):

(5)

where $R^7$ represents a $C_1$-$C_{20}$ straight-chain, branched-chain or alicyclic hydrocarbon group or aromatic-ring containing hydrocarbon group that may optionally have a fluorine, oxygen or nitrogen substituent.

7. The polymer compound according to claim 1, wherein at least either one of $R^1$ and $R^2$ includes a lactone group.

8. The polymer compound according to claim 1, wherein $R^1$ and $R^2$ partly include an acid-unstable group.

9. A coating composition prepared by dissolving the polymer compound of claim 1 in an organic solvent.

10. A photoresist using the polymer compound of claim 1.

11. A topcoat for use in liquid immersion lithography, prepared by applying the polymer compound of claim 1 to a photoresist.

* * * * *

UNITED STATES PATENT AND TRADEMARK OFFICE
CERTIFICATE OF CORRECTION

PATENT NO. : 7,517,635 B2
APPLICATION NO. : 11/509638
DATED : August 25, 2006
INVENTOR(S) : Satoru Miyazawa et al.

It is certified that error appears in the above-identified patent and that said Letters Patent is hereby corrected as shown below:

Title Page,

Item (75), Inventors, should read:

Satoru Miyazawa, <u>Kamifukuoka</u> (JP);
Satoru Kobayashi, <u>Iruma</u> (JP);
Kazuhiko Maeda, <u>Hino</u> (JP)

Signed and Sealed this

Twenty-fifth Day of August, 2009

David J. Kappos
*Director of the United States Patent and Trademark Office*